United States Patent [19]

Rostoker et al.

[11] Patent Number: 5,644,143
[45] Date of Patent: Jul. 1, 1997

[54] METHOD FOR PROTECTING A SEMICONDUCTOR DEVICE WITH A SUPERCONDUCTIVE LINE

[75] Inventors: Michael D. Rostoker, Boulder Creek; Mark Schneider, San Jose; Nicholas F. Pasch, Pacifica; Abraham Yee, Santa Clara; William C. Schneider, Mountain View, all of Calif.

[73] Assignee: LSI Logic Corporation, Milpitas, Calif.

[21] Appl. No.: 454,542

[22] Filed: May 30, 1995

Related U.S. Application Data

[62] Division of Ser. No. 233,607, Apr. 22, 1994, Pat. No. 5,593,918.

[51] Int. Cl.$^6$ .............................. H01L 29/06; H01L 39/00
[52] U.S. Cl. .............. 257/30; 257/661; 257/662; 257/663; 257/666; 505/191; 505/237; 505/847; 505/900
[58] Field of Search ................ 257/30, 661, 662, 257/663, 666; 505/191, 237, 847, 900

[56] References Cited

U.S. PATENT DOCUMENTS

| | | | |
|---|---|---|---|
| 4,837,609 | 6/1989 | Gurvitch et al. | 357/71 |
| 4,953,005 | 8/1990 | Carlson et al. | 357/80 |
| 5,227,361 | 7/1993 | Yamazaki | 505/1 |
| 5,304,539 | 4/1994 | Allen et al. | 505/473 |

FOREIGN PATENT DOCUMENTS 1136377  5/1989  Japan ........................... 257/661

*Primary Examiner*—Sara W. Crane
*Assistant Examiner*—Howard Weiss
*Attorney, Agent, or Firm*—Katz & Cotton, LLP

[57] ABSTRACT

Various techniques for forming superconductive lines are described whereby superconductive lines can be formed by stamping, etching, polishing, or by rendering selected areas of a superconductive film (layer) non-superconductive. The superconductive material can be "perfected" (or optimized) after it is formed into lines (traces). In one embodiment, trenches are etched in a substrate, the trenches are filled with superconductive material, and any excess superconductive material overfilling the trenches is removed, such as by polishing. In another embodiment, superconductive lines are formed by rendering selected areas of a superconductive layer (i.e., areas other than the desired superconductive lines) non-superconductive by "damaging" the superconductive material by laser beam heating, or by ion implantation. Superconductive lines formed according to the invention can be used to protect semiconductor devices (e.g., transistor structures) from over-current or overheating conditions such as those caused by CMOS latch-up. Current density limits and/or thermal limits of superconductors are employed to cause a superconductive trace to become non-superconductive when these limits are exceeded.

7 Claims, 8 Drawing Sheets

METHOD FOR PROTECTING A SEMICONDUCTOR DEVICE WITH A SUPERCONDUCTIVE LINE

This is a divisional of commonly owned application Ser. No. 08/233,607, filed Apr. 22, 1994, now U.S. Pat. No. 5,593,918.

TECHNICAL FIELD OF THE INVENTION

The present invention relates to the fabrication and packaging of semiconductor devices.

BACKGROUND OF THE INVENTION

Generally speaking, there are two principal areas of concern in semiconductor device technology—namely, conveying signals and currents into and within a semiconductor die, and processing the signals within the die. The present invention concerns itself with conveying signals and currents from sources (systems) outside of the die to the die, and conveying signals and currents within the die, such as from circuit element (e.g., transistor structure) to circuit element. The problems and challenges associated with each are similar in kind, but occur on a vastly different scale than one another.

For example, a semiconductor die will typically be mounted to some sort of leadframe or substrate having conductive fingers or traces, respectively, on the order of one or a few thousandths of an inch (bond wires are included in this perspective). Within the die, however, the conductive lines formed on the die tend to be on the order of one micron (μm). Each of these current and signal conveying milieus, is bound (limited) by its own unique set of limitations.

For example, conductive fingers on leadframes and conductive traces on substrates for mounting semiconductor dies suffer, generally, from the inability to achieve a relatively fine pitch. In other words, it is difficult to achieve a close spacing of small conductors, especially in the vicinity of a die-receiving area, even if the conductors fan-out from the die-receiving area.

Vis-a-vis conductive lines on the die itself, there are problems associated with the very large number of conductive lines required to interconnect the vast number of circuit elements formed on the die, and although it is feasible to construct lines with widths less than one micron, such finer-and-finer lines are simply incapable of carrying much current, and exhibit adverse parasitic characteristics.

As is known, the resistance exhibited by a conductive line is a function of the resistivity and cross-sectional area of the conductive material of the conductor. Present day semiconductor fabrication processes already allow the reliable formation of metal (e.g., aluminum) lines having a width (as measured across the surface of the semiconductor die) on the order of 0.5–0.7 μm, and the formation of poly (polysilicon) lines having a width on the order of 0.5–0.6 μm. Seemingly already small, it has been the object of prolonged endeavor to make conductive lines on a die even smaller. Coupled with certain limitations on the ability to form thick lines, the cross-sectional area of the lines is become ever smaller. This can be disadvantageous, since high current densities (on the order of $10^6$ Amps/cm$^2$) will cause a conductor to exhibit significant electromigration of atoms from one end of the line towards the other end of the line, which may result in catastrophic thinning or voiding of the line.

Generally, the present invention addresses a range of concerns in the design and fabrication of semiconductor integrated circuit (IC) devices. Present efforts are generally directed to the complementary goals of decreased circuit size and/or higher circuit density. These goals are generally achieved by providing smaller circuit elements (e.g., transistor structures), and/or by placing greater numbers of these elements on a given semiconductor die (chip). These trends are evidenced in the design and fabrication of virtually all types of integrated circuits, including custom and semi-custom application-specific integrated circuits (ASICs), memory chips, logic chips, and other IC structures. These trends are fueled by a desire for (and a market demand for) integrated circuits of greater complexity and capability, and are made possible by recent advances in semiconductor fabrication equipment and processes.

In general, the transistor, in any of its several different forms (e.g., bipolar, MOS, and the like) is the basic building block of most modern ICs, and is incorporated into many elemental structures of modern digital integrated circuitry (e.g., logic circuits, memory cells, and the like). Very complex and capable circuitry is implemented by forming several, up to millions of, transistor structures on a single semiconductor die and connecting these transistor structures together (and/or to other elements formed on the semiconductor die) and/or fabricating additional circuit elements atop the transistor structures. Transistor structures are already being formed with overall dimensions as small as on the order of 20–40 μm (microns) across (wide), and are expected to become even smaller as semiconductor fabrication processes improve.

In fabricating integrated circuits containing ever-greater numbers of ever-smaller transistor structures on a die, an ancillary need arises for processing techniques capable of providing more-and-more, smaller-and-smaller conductive lines on the die, for interconnecting ("wiring") the transistor structures to one another, and for connecting the circuitry on the die to Input/Output (I/O) bond pads on the die. Evidently, there is a need for a great many of these conductive lines on a given die. (For example, two or three lines per transistor.) Since these interconnecting conductive lines perform only a 'passive' function (i.e., carrying signals and/or power to and from circuit elements), there is considerable pressure to make these conductive lines as small (fine, narrow) as possible so that they do not occupy and dominate valuable 'real estate' (die surface area) that could be better used for 'active' circuitry (i.e., for logic, switching, amplifying, etc.).

Typically, conductive lines on a semiconductor die are formed of conductive material such as a metal (e.g., aluminum, tungsten, or the like) or polysilicon ("poly", or doped polysilicon), or silicides (silicon-metal compounds).

As transistor size (and semiconductor feature size, in general) decreases, the currents which flow between circuits also tend to decrease. This limits, to some extent, the effect of higher resistance conductive lines (due to smaller size). However, maximizing the speed of integrated circuits remains a highly desirable goal. Higher resistance conductive lines contribute to on-chip wiring (conductive line) delays when combined with the effects of parasitic capacitances. The wiring resistance and the capacitances combine to form an R-C network which slows voltage waveforms, thereby slowing overall circuit performance. Evidently, keeping the resistance of conductive lines small would serve to improve circuit speed. However, the trend toward smaller circuits forces the size of conductive lines downward, thereby tending to increase their resistance per unit of length.

Although currents between transistors on an integrated circuit tend to decrease in magnitude with the size of the transistors, the currents required at the I/O pads of the integrated circuit generally do not decrease commensurately. In general, the same or similar current carrying capability is required at the "pins" (e.g., bond pads) of the integrated circuit, regardless of the circuit geometry. Inrush currents and high I/O currents can severely stress the current carrying capability of small conductors, causing them to "blow" like fuses in extreme cases.

As evidenced by the above discussion, what is needed are techniques of forming conductive lines on a semiconductor die which are extremely small, yet exhibit extremely low resistivity (i.e., high conductivity).

In recent years, new materials have been discovered which exhibit super-conductivity at relatively high temperatures. Examples of these materials are thallium and YBCO (yttrium barium copper oxide). Thallium films, for example, have been found to be useful in microwave and RF applications. Other materials and compounds will become available in the future, and are within the intended scope of the present invention.

Although it might seem that the use of superconductive materials for conductive lines on semiconductor dies is somewhat self-evident, the materials are extremely difficult to pattern, because, inter alia, of their inability to be etched with high resolution, high productivity plasma equipment. Neither the superconductors nor their component atoms form volatile compounds which can easily be removed. Wet etching is possible, but not easy, and the masking of high resolution lines is problematic (e.g., using photolithography techniques).

Another problem which surfaces when attempting to utilize superconductors in semiconductor device assemblies is the sensitivity of the superconductors to heat. Superconductive materials exhibit their superconductivity (essentially the absence of any resistive effect whatsoever) only below a certain critical temperature. Above this temperature, the superconductive materials cease to behave as superconductors, and often exhibit extremely high resistance (i.e., they become worse conductors of current than conventional conductive lines).

Superconductors have arbitrarily been divided into two main categories: high-temperature superconductors (HTS's) and low-temperature superconductors (LTS's). Low temperature superconductors are those which exhibit superconductivity only at temperatures below 30° K. (Kelvin). High temperature superconductors are those which remain superconductive at temperatures above 30° K. Some high-temperature superconductors, such as those based on Yttrium exhibit superconductivity at temperatures well over 100° K. A problem that would be inherent in using superconductors on or near an operating semiconductor device is the often significant amount of heat generated by the device itself. Because of their sensitivity to heat, superconductors employed in conjunction with semiconductor device assemblies would appear to require some form of active (or other extensive) cooling, to prevent the superconductors from becoming non-superconductive (and highly resistive) when exposed to the heat generated by operating semiconductor devices. Techniques such as immersion in liquid nitrogen come immediately to mind to effect this cooling. However, even when superconductive structures are cooled with liquid nitrogen, a semiconductor device operating in close proximity to a high-temperature superconductor can cause portions of the superconductor to reach a temperature higher than its critical temperature, thereby causing the superconductor to exhibit localized high resistance. This would tend to limit the overall usefulness of superconductors, as it would impose stringent, in some cases impossible, limits on the power which could be dissipated in semiconductor device assemblies to lower power levels. This argues against the utility of using superconductors, in any form, in connection with high speed, high power semiconductor devices which could benefit greatly from the attributes of superconductors.

As used herein, the term "semiconductor device" preferably refers to a semiconductor die having circuit elements and conductive lines formed on a surface thereof, and the term "semiconductor device assembly" preferably refers to a semiconductor device mounted on, within or to a package element, such as to a leadframe. The term "leadframe", as used herein, includes usages that are broader than traditional sense of leadframes.

Other known problems addressed by the present invention are semiconductor circuit element failure due to over-current conditions (e.g., due to parasitic SCR latch-up), and semiconductor circuit element failure due to overheating.

DISCLOSURE OF THE INVENTION

It is therefore an object of the present invention to provide techniques for fabricating improved semiconductor devices and semiconductor device assemblies.

It is a further object of the present invention to provide techniques for forming superconductive lines and traces in semiconductor device assemblies.

It is a further object of the present invention to provide a technique for forming a superconducting leadframe for a semiconductor device assembly.

It is a further object of the present invention to provide a technique for protecting interconnecting lines from failure due to over-current conditions.

It is a further object of the present invention to provide a technique for protecting semiconductor circuit elements from failure due to over-current conditions (e.g., due to parasitic SCR latch-up).

It is a further object of the present invention to provide a technique for protecting semiconductor circuit elements from failure due to overheating.

According to a preferred mode of the invention, superconductive traces are formed from a film layer of a superconductive material by destroying the superconductive properties of selected areas of the material. Remaining "undestroyed" areas remain superconductive. The superconductive material is altered and "damaged" by heating it in a localized fashion, for example with a laser. When the superconductive material is heated in this fashion in a suitable gaseous environment, it combines with gas molecules to form a non-conductive material. In this manner, the superconductive material can be rendered non-conductive in selected areas, even though no significant amount of material is removed.

Further according to the invention, the "processed" areas of the superconducting material (i.e., those which are rendered substantially non-conductive) are selected to leave a pattern of interconnecting superconductive traces.

According to an aspect of the invention, the traces can be formed as a superconducting leadframe for use in a semiconductor device assembly. In this manner, the term "leadframe" will refer both to the pattern of conductive traces on the semiconductor die for transistor or gate connection, but can also be used to develop a leadframe from the I/O bond pads to the outside of a package body. Thus, the same or similar methods and structures can be formed on the die or on, or within, a package body.

According to another aspect of the invention, the traces can be formed on a surface of a semiconductor device to provide superconducting interconnections between circuit elements on the semiconductor device and/or superconducting "bond" pads (external connection points) on the semiconductor device and/or from the bond pads through the package body to a board or the like.

According to another aspect of the invention, the superconductive traces can be formed on a non-conducting substrate.

According to another aspect of the invention, the substrate can be a backing material to provide mechanical support for the superconducting traces.

According to another aspect of the invention, the substrate can be formed of a "sacrificial" material which is removed after processing at least a portion of the superconductive film, leaving behind a patterned superconductive leadframe for semiconductor device assembly formed from the superconductive material. In such an arrangement, the "sacrificial" substrate can be formed of a material which can be dissolved away, etched away, or "peeled" away from the superconductive traces or material.

Further, according to the invention, rather than subjecting the superconductive material to a laser beam (and gaseous environment) the superconductor can be processed by selectively subjecting it to ion implantation. A photoresist (or other suitable) film is patterned over areas of a superconductive film which are to remain "un-damaged" by subsequent ion-implantation. The superconductive film (and resist) are then exposed to ion-implantation with a suitable atomic species (at a sufficiently high "dosage" level) to "destroy" the superconductive characteristics of those areas of the superconductive film not covered by the resist film. The resist film can then be removed by conventional means (e.g., by washing, abrasion (polishing), or etching).

Further, according to the invention, flush superconductive traces can be formed on a surface of a substrate by etching a set of trenches into the surface of a layer of a non-conducting material (e.g., silicon dioxide) in the pattern of a set of yet-to-be-formed superconductive traces. A layer of superconductive material is disposed over the surface of the non-conductive material, completely filling the trenches (at least such that it forms a unbroken line, not necessarily that the entire depth or width of the channel is filled) and covering entire surface of the non-conductive layer. The superconductive layer is then polished back, for example by using a chemical-mechanical, or other, lapping, etching or polishing (hereinafter "polishing") technique (well known to those of ordinary skill in the art), until the superconductive material remains substantially only in the trenches.

According to an aspect of the invention, the composition of the superconductive material can be "perfected" (i.e., final processing of the superconductive material can be performed to "activate" it) after polishing.

According to another aspect of the invention, the substrate itself can be a non-conducting material, thereby eliminating the need for a separate non-conductive layer on the surface. The trenches are etched, or otherwise formed, directly into the surface of the substrate material.

Further, according to the invention, superconductive lines can be formed on a surface of a substrate by forming a layer of superconductive material over the surface of the substrate and wet etching it with the aid of a photo-resist material.

Further, according to the invention, a superconducting leadframe for semiconductor device assembly can be formed by stamping. A sheet of a backing material is stamped to form a plurality of leadframe fingers. Superconductive material disposed on a surface of the fingers provides the superconducting characteristic of the leadframe.

According to an aspect of the invention, the superconducting material can be deposited on a surface of the sheet of backing material prior to stamping.

According to another aspect of the invention, the composition of the superconducting material can be "perfected" or optimized after stamping.

According to another aspect of the invention, the superconducting material can be deposited on the surface of the backing material after stamping.

According to another aspect of the invention, the superconducting material can be deposited, then unwanted superconducting material can be etched off.

According to the invention, superconductive traces such as those described hereinabove can be employed to provide protection against over-current or overheating conditions in a semiconductor device (e.g., CMOS latch-up). In one such embodiment, a superconductive trace is used to supply current to a circuit element in a semiconductor device. The circuit element has a normal current draw. If the circuit element should latch-up or otherwise fail, the current draw increases to a higher level. The superconductive trace is sized (in cross-section) such that the increased current draw of the circuit element (when latched or failing) causes the current density in the superconductive trace to rise to a level sufficient to quench superconductivity of the superconductive trace. The superconductive trace (now resistive) heats. By dropping out of superconductivity, the superconductive trace effectively cuts off current to the circuit element and protects it. When the superconductive element cools, superconductivity is restored.

According to another aspect of the invention, the superconductive trace can be positioned such that it is subjected to heat emanating from the circuit element. When the circuit element latches-up or overloads, it generates heat which heats the superconductive trace and causes it to drop out of superconductivity. The limiting effect is much the same as that described above for current density limiting. When the superconductive trace (and circuit element) cools, superconductivity is restored.

According to an aspect of the invention, the transition of the superconductive trace to a non-superconductive trace can be sensed by another circuit in the semiconductor device to activate other signalling and/or protection mechanisms, such as resetting related circuits, etc.

Other objects, features and advantages of the invention will become apparent in light of the following description thereof.

DETAILED DESCRIPTION OF THE INVENTION

According to the invention, superconductive traces can be formed from a film layer of a superconductive material by destroying the superconductive properties of selected areas of the material. Remaining "un-destroyed" areas will remain superconductive. Evidently, superconductive properties of a superconductive material can be destroyed in a localized fashion by laser "ablation", i.e., by directing a laser beam at the superconductive material and heating it. The superconductive material is altered and "damaged" by the laser. When the superconductive material is heated in this fashion in a suitable gaseous environment, it combines with gas molecules to form a non-conductive material. (It will be readily appreciated by one of ordinary skill in the art that there are many different possible gaseous environments, such as an oxygen-containing environment, which can be employed for this purpose, and that different gaseous environments may be selected for use with different superconductive materials.) In this manner, the superconductive material can be rendered non-conductive in selected areas, even though no significant amount of material is removed.

The "processed" areas of the superconducting material (i.e., those which are rendered substantially non-conductive) can be selected to leave a pattern of interconnecting superconductive traces. The traces can be formed as a superconducting leadframe for use in a semiconductor device assembly, or can be formed on a surface of a semiconductor device to provide superconducting interconnections between circuit elements on the semiconductor device and/or superconducting "bond" pads (external connection points) on the semiconductor device.

Figure 1A:
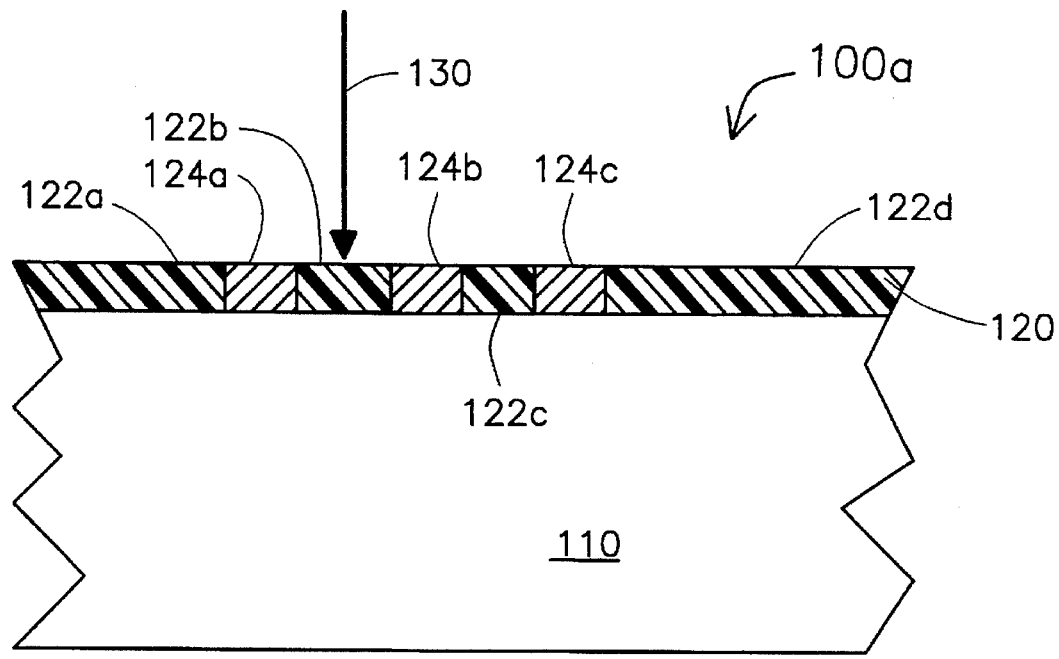
FIG. 1a is a cross-sectional view of an assembly illustrating a technique for forming a layer of a material having non-conducting (including those that may be conductive, but are at least non-superconducting) areas surrounding a pattern of superconducting traces formed therewithin, according to the invention.

FIG. 1a is a cross-sectional view of an assembly 100a of this type. The assembly 100a comprises a film layer 120 of a superconducting material formed on a surface of a substrate 110. Selected areas 122a, 122b, 122c, and 122d of the film layer 120 are exposed to a focused energy beam 130 from a laser, electron beam, or the like, preferably in a gaseous environment which will combine with the superconductive material exposed to the beam 130 to render it substantially non-conductive. Areas 124, 124b, and 124c of the superconductive film layer 120, which are not subjected to the beam 130, remain superconductive. The selected areas 122a, 122b, 122c, and 122d can be selected such that the unaffected areas 124, 124b, and 124c form superconductive traces.

According to one aspect of the invention, the substrate 110 can be a backing material for a superconductive leadframe, the conductive traces of which are provided by the unaffected areas 124a, 124b, and 124c. (According to another aspect of the invention, the substrate 110 can be an integrated circuit device.)

Assuming that the superconductive material 120 has sufficient mechanical strength, the substrate 110 can be formed of a "sacrificial" material which is removed after processing of the superconductive film 120, leaving behind a patterned superconductive leadframe for semiconductor device assembly formed from the superconductive material 120. In such an arrangement, the "sacrificial" substrate can be formed of a material which can be dissolved away, etched away, or "peeled" away from the superconductive layer 120.

Further, according to the invention, another technique for "damaging" a superconductor to render it substantially non-conductive is to subject it to ion implantation. It will be readily appreciated by one of ordinary skill in the art that superconductive materials are extremely sensitive to their chemical composition. Even slight deviations from optimal composition can be sufficient to quench superconductivity. Ion-implanting a superconductor with atomic species (e.g., phosphorous, arsenic, boron) which fatally impair the superconductive characteristics of the superconductive material can be employed to form a pattern of conductive lines in a superconductive film.

According to the invention, a photoresist film is patterned over areas of a superconductive film which are to remain "undamaged" by subsequent ion-implantation. The superconductive film (and resist) are then exposed to ion implantation with a suitable atomic species (at a sufficiently high "dosage" level) to "destroy" the superconductive characteristics of those areas of the superconductive film not covered by the resist film. The resist film can then be removed by conventional means (e.g., by washing, abrasion (polishing), or etching).

It will be readily appreciated by those of ordinary skill in the semiconductor processing art that there are many different techniques for patterning a resist film on a surface. Those of ordinary skill in the art will also readily appreciate that present resist materials are fully capable of stopping beams of ions (e.g., phosphorous, arsenic, or boron) of significant energy.

Figure 1B:
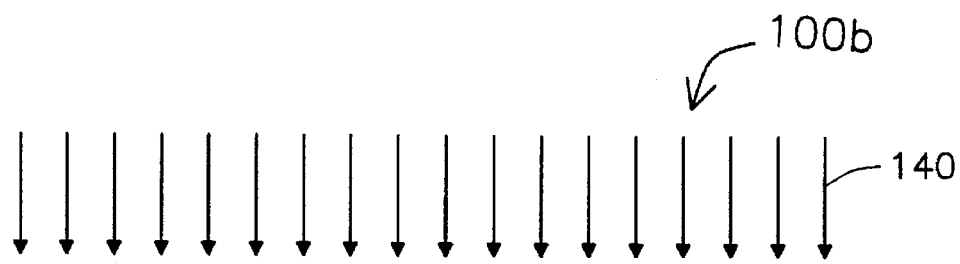
FIG. 1b is a cross-sectional view of an assembly illustrating another technique for forming a layer of a material having non-conducting including those that may be conductive, but are at least non-superconducting) areas surrounding a pattern of superconducting traces formed therewithin, according to the invention.

FIG. 1b illustrates this technique of patterning a superconductive material by ion-implantation. In FIG. 1b, the same pattern of superconductive/non-superconductive areas shown in FIG. 1a is produced by ion-implantation rather than by laser processing. FIG. 1b shows a cross-sectional view of an assembly 100b wherein the film layer 120 of superconducting material is formed on the surface of the substrate 110, as in FIG. 1a. In the case of FIG. 1b, however, selected areas 124a, 124b, and 124c of the superconductive layer 120 are covered with corresponding patterned areas 126a, 126b, and 126c of photoresist material. The remaining areas 122a, 122b, 122c, and 122d of the superconductive layer 120 which are not covered by the areas 126a, 126b, and 126c of photoresist are exposed to ion-implantation 140 of an atomic species selected to render the superconductive material non-conductive (the areas 124a, 124b, and 124c, being covered by the resist, are substantially unaffected by the ion-implantation). Areas 124a, 124b, and 124c of the superconductive film layer 120 remain superconductive. The "damaged" areas 122a, 122b, 122c, and 122d can be selected such that the unaffected areas 124a, 124b, and 124c form superconductive traces. After implantation, the resist film can be removed by conventional means (e.g., by washing, abrasion (polishing), or etching).

As described hereinabove with respect to FIG. 1a, the substrate 110 can be a backing material for a superconductive leadframe, the conductive traces of which are provided by the unaffected areas 124a, 124b, and 124c.

Also as described with respect to FIG. 1a, if the superconductive material 120 has sufficient mechanical strength, the substrate 110 can be formed of a "sacrificial" material which is removed after processing of the superconductive film 120, leaving behind a patterned superconductive leadframe for semiconductor device assembly formed from the superconductive material 120. In such an arrangement, the "sacrificial" substrate can be formed of a material which can be dissolved away, etched away, or "peeled" away from the superconductive layer 120.

The discussion above with respect to FIG. 1 is directed to selectively "damaging" areas of a superconductive film to form patterns of superconductive traces. Attention is now directed to forming patterns of separate superconductive lines.

According to the invention, a set of trenches are etched into the surface of a layer of a non-conducting material (e.g., silicon dioxide) in the pattern of a set of yet-to-be-formed superconductive traces. A layer of superconductive material is disposed over the surface of the non-conductive material, completely filling the trenches and covering entire surface of the non-conductive layer. (For the purposes of this invention, "completely filling" requires that a continuous conductive trace or line is formed. It is not necessary that the entire width and/or depth of the trench is filled.) The superconductive layer is then polished back using a chemical-mechanical polishing technique (well known to those of ordinary skill in the art) or etched, or otherwise partially removed (hereinafter, these removal techniques are collectively referred to as "polishing") until the superconductive material remains substantially only in the trenches.

It will be readily appreciated by those of ordinary skill in the art that many superconductive materials may be adversely affected by the polishing (or other partial removal) process. In these cases, those of ordinary skill in the art will immediately understand that the composition of the superconductive material can be "perfected" (i.e., final processing of the superconductive material can be performed to "activate" it) after polishing.

FIGS. 2a–2d show a substrate at various stages of this technique for forming patterned superconductive traces flush with the surface of the substrate.

Figure 2A:
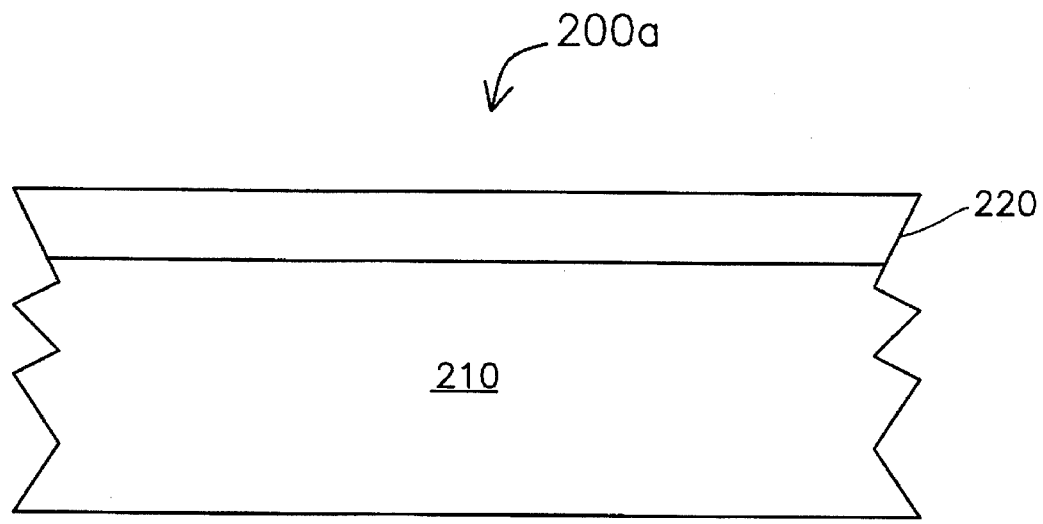
FIGS. 2a–2d are cross-sectional views of substrate at various stages of a technique for forming superconductive traces flush with the surface of the substrate, according to the invention.

FIG. 2a is a cross-sectional view of an assembly 200a comprising a substrate 210 and an overlying layer 220 of a non-conductive (or, at least, non-superconductive) material (e.g., silicon dioxide). The assembly 200a is shown prior to any processing to form superconductive traces.

Figure 2B:
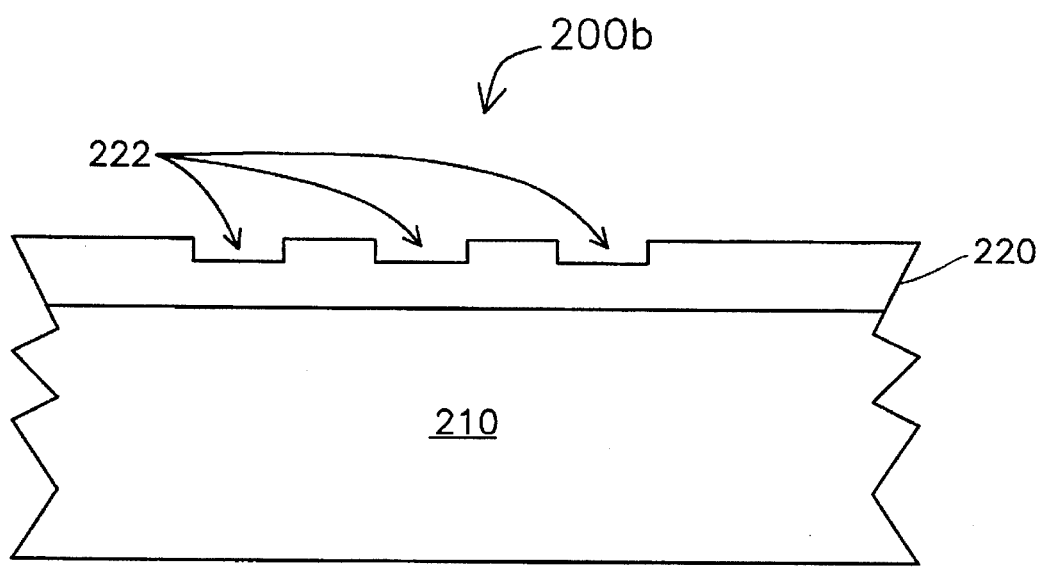

FIG. 2b is a cross-sectional view of an assembly 200b, representing the assembly 200a after a processing step whereby trenches 222 are etched into the surface of the non-conducting layer 220.

Figure 2C:
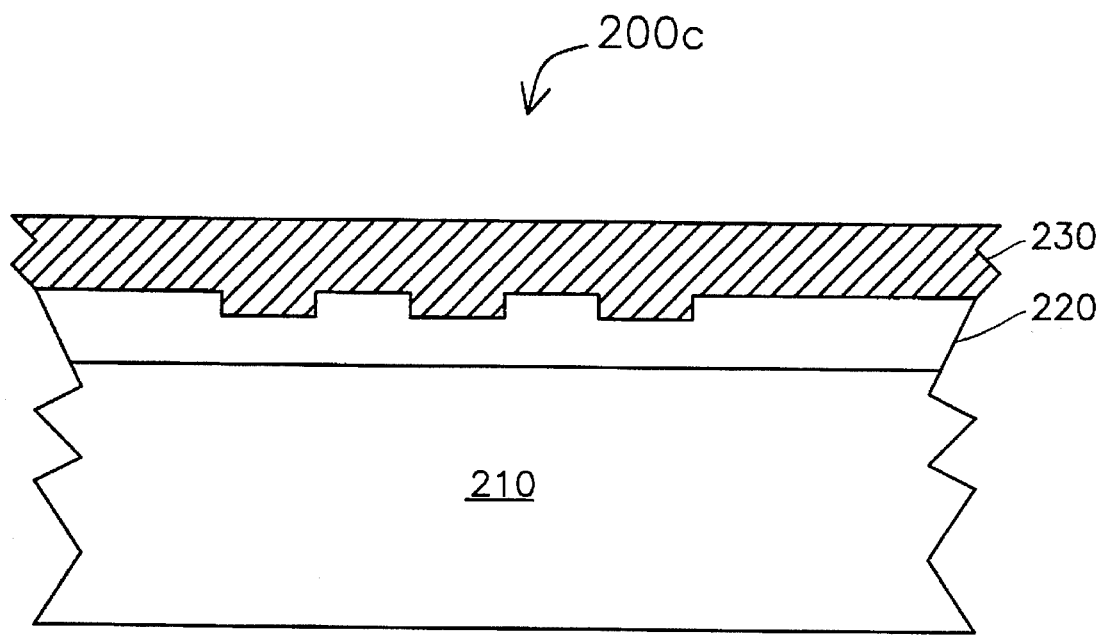

FIG. 2c is a cross-sectional view of an assembly 200c representing the assembly 200b after covering the surface of the non-conducting layer 220 with a superconductive material 230. The superconductive material 230 completely fills the trenches 222 and extends substantially completely over the surface of the non-conductive material 220.

Figure 2D:
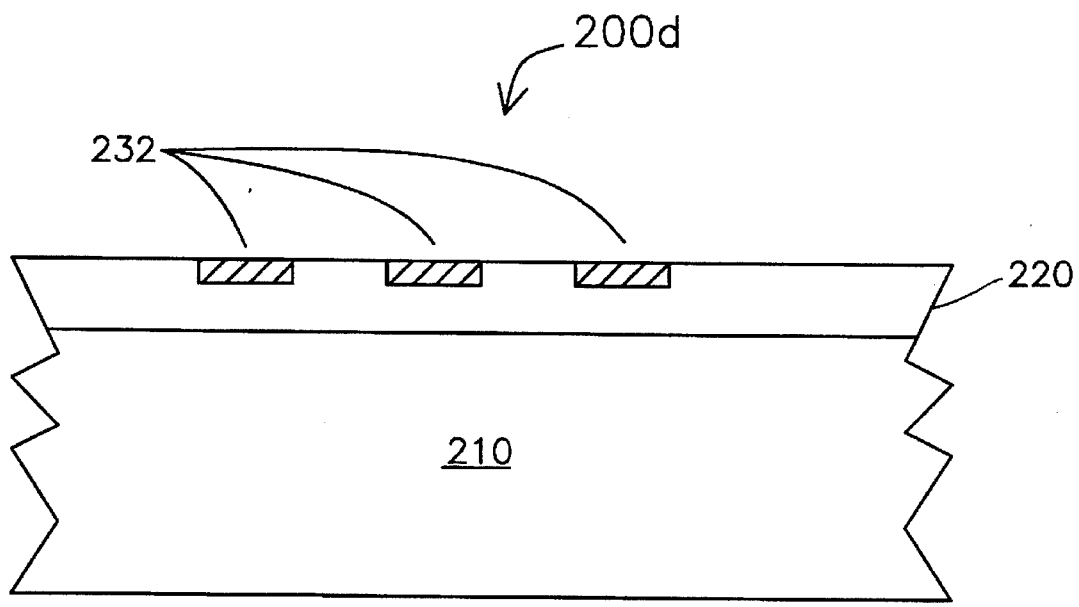

FIG. 2d is a cross-sectional view of an assembly 220d representing the assembly 200c after polishing back the superconductive material 230 until it remains only in the trenches 222 as a set of superconductive traces 232. The polishing step is accomplished using, for example, a chemical-mechanical polishing process. Chemical-mechanical polishing is widely known to those of ordinary skill in the art, and is commonly used in semiconductor processing.

It will readily be appreciated by those of ordinary skill in the art that the superconductive material 230 can be a superconductive "base" material which is subsequently processed (i.e., after polishing) to "perfect" its composition for superconductive characteristics.

It will further be appreciated by those of ordinary skill in the art that the substrate 210 itself can be a non-conductive material (e.g., silicon dioxide), thereby eliminating the need for a separate non-conductive layer 220. In this case the trenches 222 can be formed directly in the substrate 210. The only requirement for the purposes of the present invention is that the surface of the substrate be formed of a material which is non-conductive, and which can be etched, or otherwise shaped, to form trenches. Silicon dioxide is particularly well suited for this purpose, since it is non-conductive and can be readily etched, or otherwise shaped, by any of a variety of well-known techniques.

This technique for forming flush superconductive lines has several distinct advantages, including:

Patterning of the superconductive material is simple.

The superconductive traces are planar and flush with the surface of the substrate, thereby making reliable traces and simplifying subsequent processing.

The superconductive traces are encased in (oxide) trenches, making them robust and relatively tolerant of subsequent processing, unlike free-standing traces.

The superconductive properties of the superconductive traces can be developed after patterning, thereby making damage to the superconductive material during processing less of a concern.

The design rules for this patterning technique are dictated primarily by the ability to form trenches in a non-conductive material (e.g., an oxide layer), rather than by the ability to process the superconducting material.

FIGS. 3a–3d are directed to another technique for forming separate superconductive traces by etching.

Figure 3A:
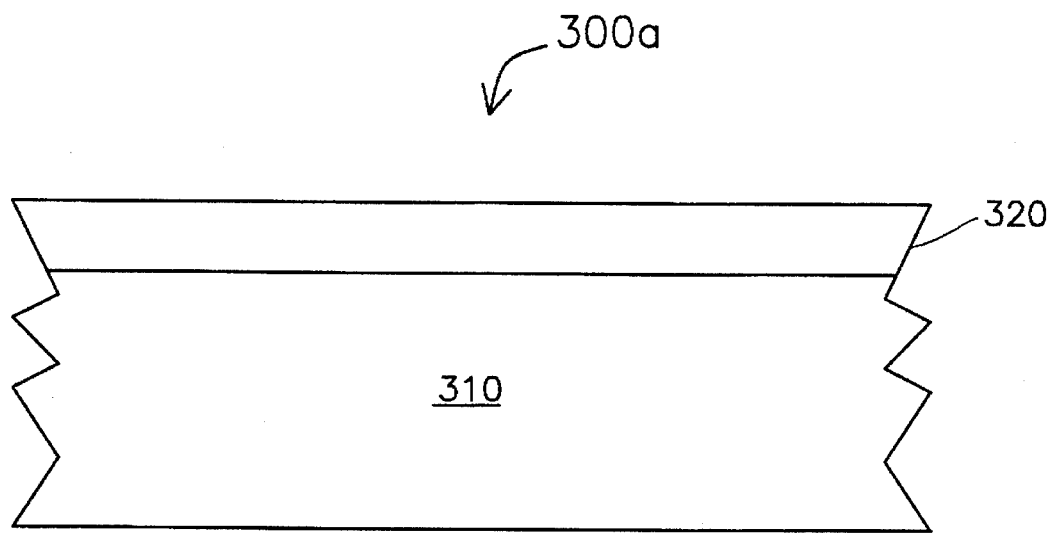
FIGS. 3a–3d are cross-sectional views of substrate at various stages of a technique for forming superconductive traces on the surface of the substrate, according to the invention.

FIG. 3a is a cross-sectional view of a substrate 300a comprising a base substrate material 310 and an overlying film layer of a superconductive material 320, prior to patterning of the superconductive material 320 into superconductive traces.

Figure 3B:
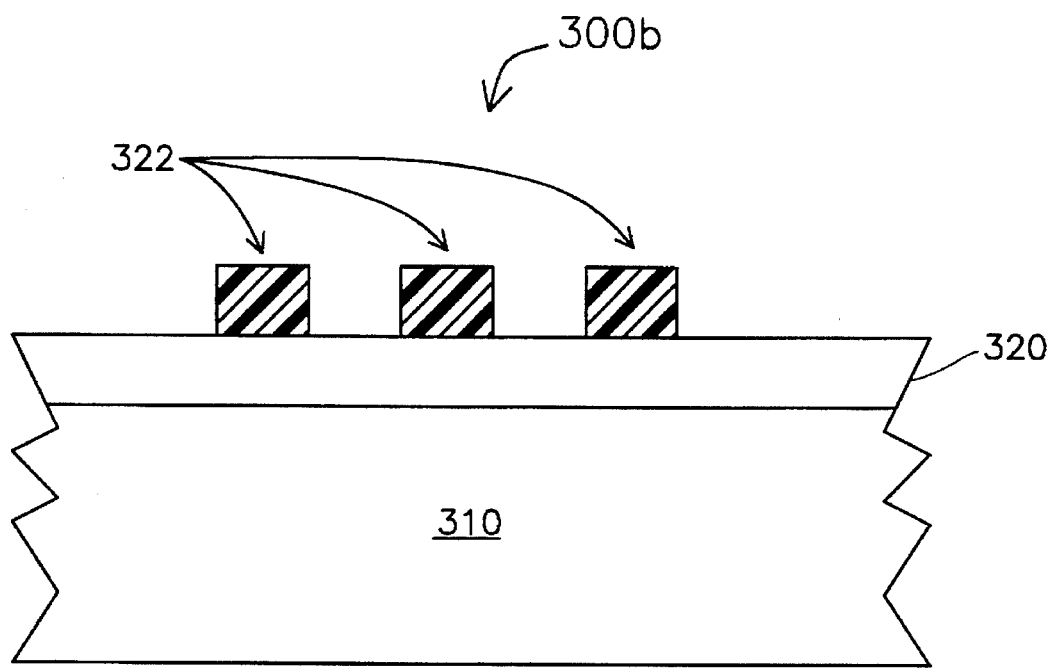

FIG. 3b is a cross-sectional view of a substrate 300b, representing the substrate 300a of FIG. 3a after forming a patterned resist layer 322 on top of the film layer of superconductive material 320. Areas of the superconductive material 320 not covered by the patterned resist layer 322 (i.e., "exposed" areas of the superconductive material 320) will be etched away in a subsequent etching process, leaving a pattern of superconductive traces corresponding to the pattern of the patterned resist layer 322.

Figure 3C:
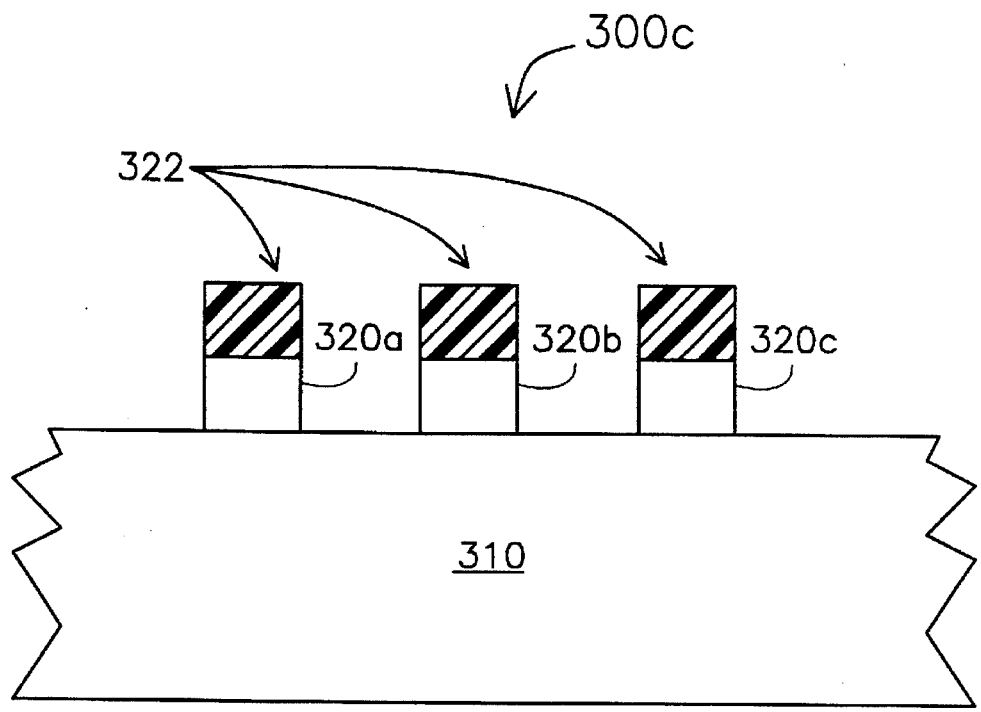

FIG. 3c is a cross-sectional view of a substrate 300c, representing the substrate 300b of FIG. 3b after etching in a selective etch process to remove exposed areas of the superconductive material 320. The etch process is selective to the superconductive material 320, etching the superconductive material 320 in preference to the resist layer 322 and the base substrate material 310. After etching, "protected" areas 320a, 320b, and 320c of the superconductive material 320, protected from the etching process by the patterned resist layer 322, remain behind in the form of superconductive traces. The patterned resist layer 322 can subsequently be removed by any suitable method (e.g., washing, etching, polishing, etc.).

Figure 3D:
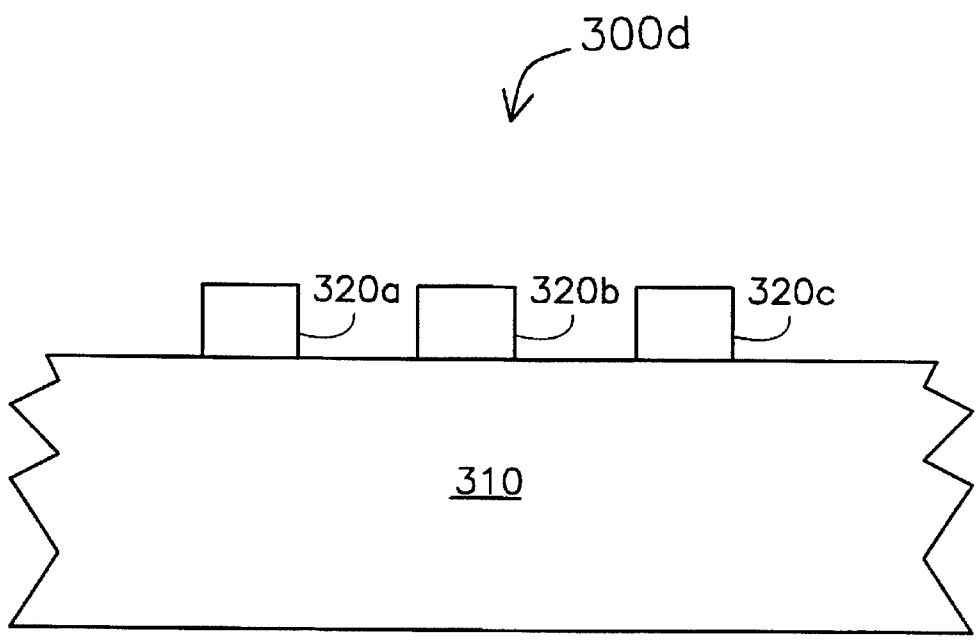

FIG. 3d is a cross-sectional view of a substrate 300d, representing the substrate 300c of FIG. 3c after removal of the patterned resist layer 322. Separate conductive traces 320a, 320b, and 320c now remain on the surface of the base substrate material 310, having been formed thereupon in the foregoing etching process.

As with the other techniques described hereinabove, this technique can be used to form traces of a superconducting leadframe, or to form superconducting lines on a surface of a semiconductor device.

Figure 4A:
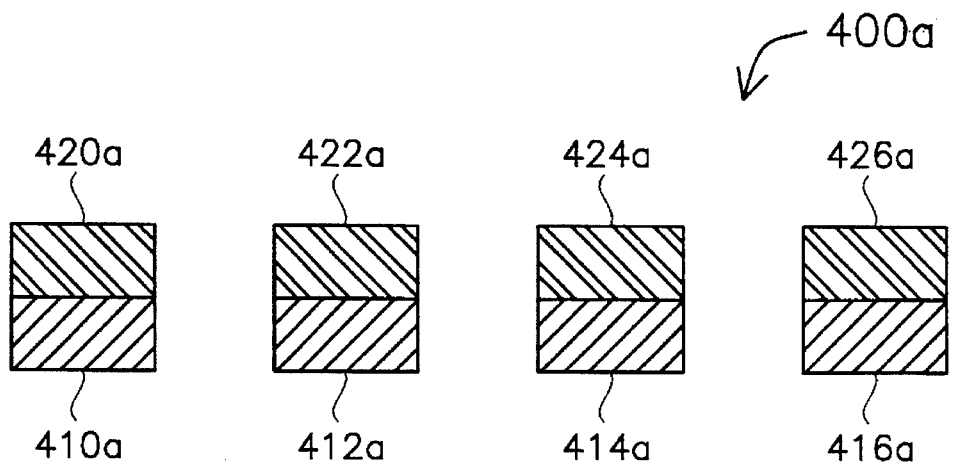
FIGS. 4a–4c are cross-sectional views of various embodiments of a stamped superconducting leadframe for semiconductor device assembly.
Figure 4B:
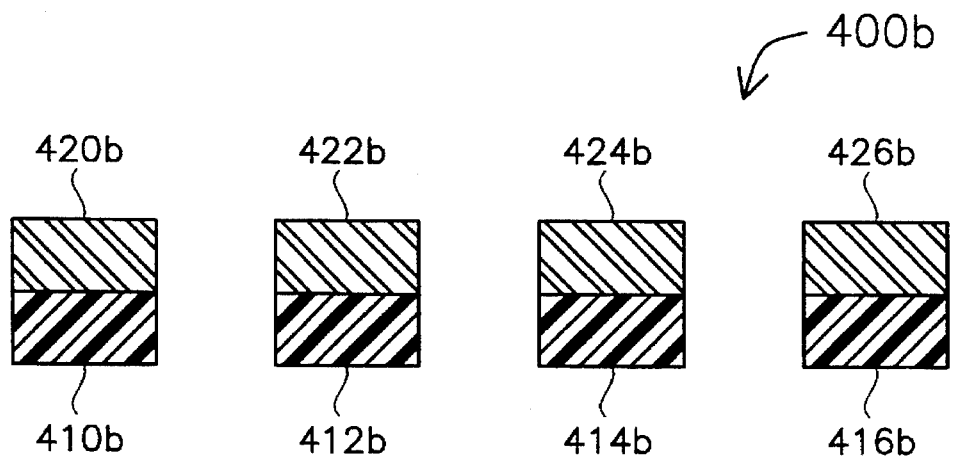
Figure 4C:
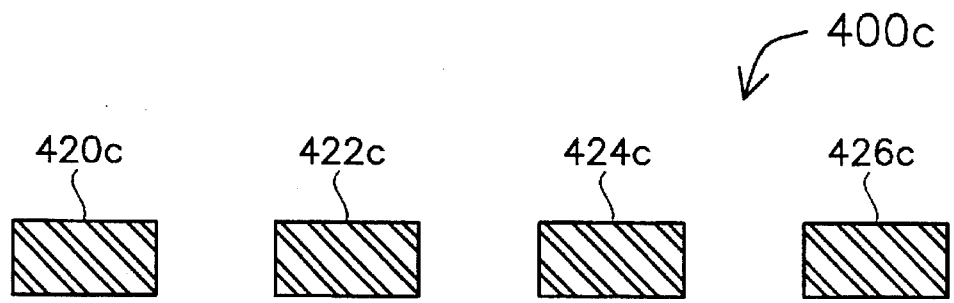

FIGS. 4a–4c are directed to a technique for forming a stamped superconducting leadframe for semiconductor device assembly.

FIG. 4a is a cross-sectional view of a portion of a stamped leadframe assembly 400a. The leadframe assembly 400a comprises a plurality of conductive fingers, of which 410a, 412a, 414a, and 416a are exemplary. Each of fingers 410a, 412a, 414a, and 416a has a respective superconductive trace 420a, 422a, 424a, and 426a, formed on a surface thereof. The leadframe assembly 400a is intended to be used in a semiconductor device assembly to provide the benefit of superconducting connections to a semiconductor device. Bond pads of the semiconductor device will be connected to the superconducting traces 420a, 422a, 424a, and 426a to establish electrical connection therewith. The assembly will be actively (or otherwise extensively) cooled (e.g., by immersion in liquid nitrogen coolant) to support the superconductivity of the superconductive traces 420a, 422a, 424a, and 426a. Although the fingers 410a, 412a, 414a, and 416a are generally conductive, the zero-resistance superconductivity of the superconductive traces 420a, 422a, 424a, 426a will dominate the electrical characteristics of the leadframe as long as their superconductivity is maintained. The main purpose of the conductive fingers 410a, 412a, 414a, and 416a is to provide mechanical support for their respective superconductive traces 420a, 422a, 424a, and 426a. Preferably, the conductive material will be chosen to have a coefficient of thermal expansion similar to that of the superconductive material to minimize thermally induced stresses therebetween.

The leadframe assembly 400a can be formed by one of several different methods:

(1) A layer of superconductive material can be formed over a sheet of traditionally conductive material (e.g., copper or aluminum). The sheet can then be stamped (e.g., with a die) to form the superconductive leadframe assembly 400a;

(2) A sheet of conductive base material can be stamped to form a leadframe shape with conductive fingers, and the superconductive material can be deposited on the surface of the leadframe fingers; or 3) The leadframe can be formed much as described in 1) above, but the chemical composition of the superconductive material can be "perfected" (as described hereinabove with respect to FIGS. 2a–d) after stamping.

Vis-a-vis perfecting the composition of the superconductive material (see (3), immediately above), it is also possible to dope a non-superconductive material such that doping, heating, etc. will cause the material to become superconducting.

FIG. 4a is based on a superconducting leadframe assembly using an electrically conductive base material. This can be advantageous, in that electrical conductors are often good heat conductors, facilitating cooling of the superconductive traces and heat removal from a semiconductor device connected to them. However, it is possible and may be desirable to accomplish the same end using a non-conductive (insulating) base material, such as mylar (tm). Preferably, the conductive base material will be a good thermal conductor, but this is not essential to the inventive technique, since active cooling provided to maintain superconductivity may not necessarily require any assistance.

FIG. 4b is a cross-sectional view of a portion of a stamped superconductive leadframe assembly 400b, similar to 400a (FIG. 4a) but having non-conductive fingers 410b, 412b, 414b, and 416b, rather than the conductive fingers (410a, 412a, 414a, and 416a, of FIG. 4a. Each finger 410b, 412b, 414b, and 416b has a respective superconductive trace 420b, 422b, 424b, and 426b formed on a surface thereof. Alternatively, the non-conductive material may be formed into a sheet (not shown) with traces 420b, 422b, 424b and 426b formed thereon.

The leadframe assembly 400b behaves in much the same manner as the leadframe assembly 400a and is intended for use in the same manner (i.e., a semiconductor die is electrically connected to the superconductive traces 420b, 422b, 424b, and 426b to establish superconductive electrical connections to the die via the leadframe assembly 400b).

The leadframe assembly 400b can be formed by any of the three techniques described above with respect to FIG. 4a, with the exception that the "conductive" base material is replaced by the non-conductive base material described for FIG. 4b.

If a superconducting material has sufficient mechanical strength, then the need for a base material is effectively eliminated. FIG. 4c is a cross-sectional view of a portion of a superconducting leadframe assembly 400c in which superconducting fingers 420c, 422c, 424c, and 426c are sufficiently strong to stand alone. The leadframe assembly 400c is formed by direct stamping of a sheet of the superconductive material which forms the superconducting fingers 420c, 422c, 424c, and 426c. Alternatively, superconductive traces can be built-up on a base with the base subsequently removed.

If the particular superconductive material to be used is not tolerant of the stamping process, then a superconductive "base" material can be used for stamping. The composition of the base material can be "perfected" after stamping (as described hereinabove).

In the present context, that is, in the context of superconductive traces used in semiconductor device assemblies, superconductive materials have a number of unusual and useful characteristics. Superconductive materials can be caused to become non-superconductive, or even non-conductive by elevating their temperature above a critical temperature. Each superconductive material has its own critical temperature below which superconductivity is exhibited. Superconductive materials can also be coerced out of superconductivity when electrical current density above a critical threshold is passed through them. This current limit characteristic exists apart from temperature-related superconductivity criteria.

FIGS. 5a–5d are directed using these characteristics of superconductors (i.e., current density limits and threshold temperature limits on superconductivity) to protect against overload conditions in semiconductor devices.

Figure 5A:
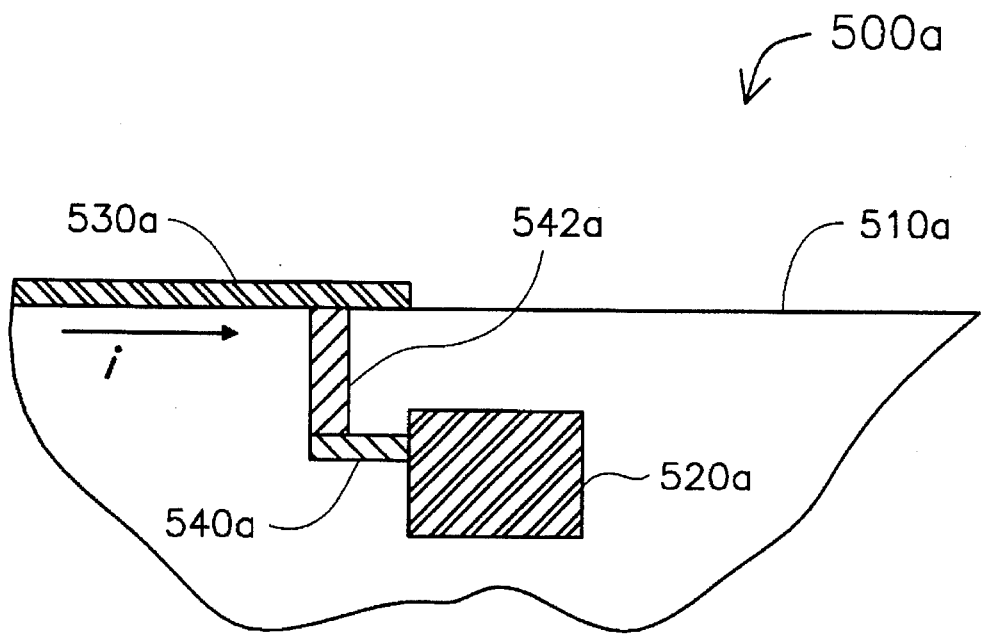
FIG. 5a is a cross-sectional view of a semiconductor device assembly employing a superconductive element to provide over-current protection, according to the invention.

FIG. 5a is a cross-sectional view of a semiconductor device 500a having an active CMOS (i.e., Complementary Metal Oxide Semiconductor, describing the structure of a transistor) electronic element 520a formed therewithin. The device incorporates MOS (Metal Oxide Semiconductor) transistors. As is well known in the art, CMOS devices are prone to a latch-up condition which can occur when a parasitic electronic device formed with its MOS transistors is activated. Under this latch-up condition, excessive current is drawn and significant heat is generated. This latch-up current and heat can be sufficient to damage the semiconductor device 500a. About the only effective way to stop the latch-up condition is to remove power from the affected circuit elements/transistors.

Electrical conductors 540a and 542a extend from the electronic element 520a to the surface 510a of the semiconductor device 500a. A superconductive trace 530a on the surface 510a is used to carry a current (i) to the circuit element 520a via the conductors 540a and 542a. In the event that the circuit element 520a latches up, an increase in the current (i) occurs. The superconductive trace 530a is sized (in cross-section) such that the increased current causes current density in the superconductive trace 530a to exceed its superconductivity limits, thereby causing the superconductive trace 530a to become non-superconductive (resistive). As a result of the new resistance in the trace 530a, it immediately heats up, completely quenching superconductivity and effectively cutting off the current (i) to a level where the latch-up condition is terminated. When the superconductive trace 530a cools again, its superconductivity is restored, thereby restoring normal operation of the circuit element 520a. In this way, the superconductive trace behaves something like a self-resetting circuit breaker.

Figure 5B:
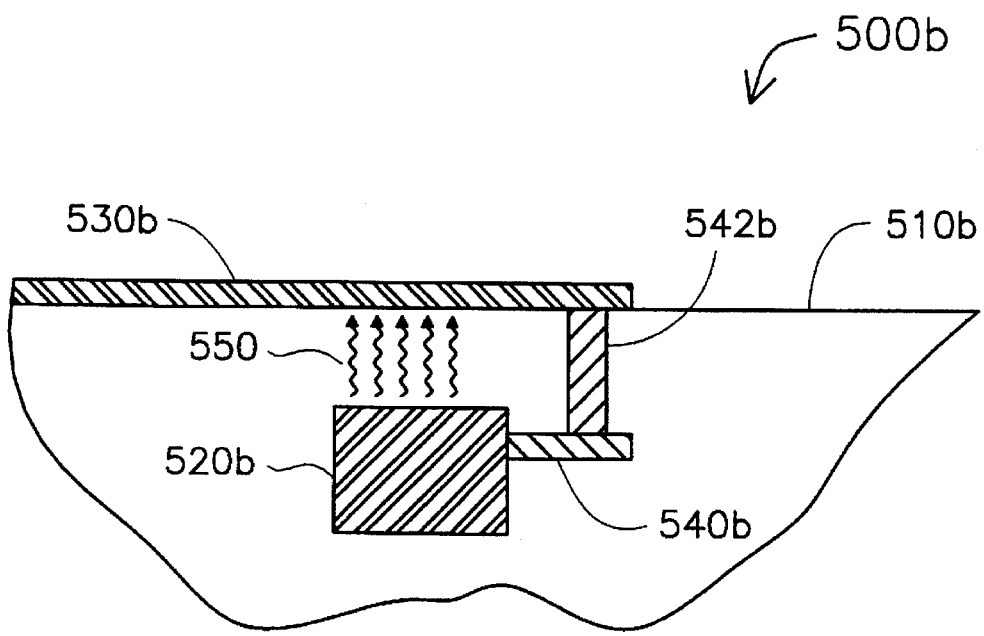
FIG. 5b is a cross-sectional view of a semiconductor device assembly employing a superconductive element to provide thermal protection, according to the invention.

FIG. 5b is a cross-sectional view of another semiconductor device 500b having an active CMOS electronic element 520b formed therewithin. As before, the device incorporates MOS transistors which are subject to the aforementioned latch-up condition. As in the semiconductor device 500a, electrical conductors 540b and 542b extend from the electronic element 520b to the surface 510b of the semiconductor device 500b. In this semiconductor device 500b, however, a superconductive trace 530b on the surface 510b which is used to carry a current (i) to the circuit element 520b via the conductors 540b and 542b overlies the circuit element 520b and is subjected to heat 550 generated by the circuit element 520b. In the event that the circuit element 520b latches up, heat generated by the circuit element 520b completely quenches superconductivity of the superconductive trace 530b, effectively cutting off the circuit element 520b and terminating the latch-up condition. When the circuit element 520b and superconductive trace 530b cool again, superconductivity is restored thereby restoring normal operation of the circuit element 520b. As before, the superconductive trace 530b behaves something like a self-resetting circuit breaker.

Figure 5C:
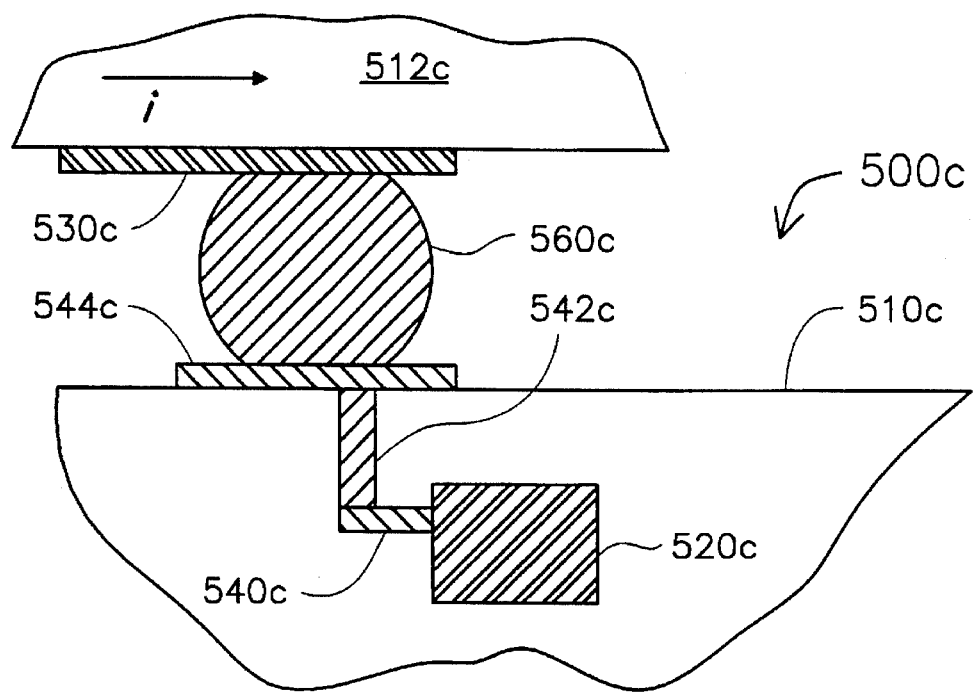
FIG. 5c is a cross-sectional view of another semiconductor device assembly employing a superconductive element to provide over-current protection, according to the invention.
Figure 5D:
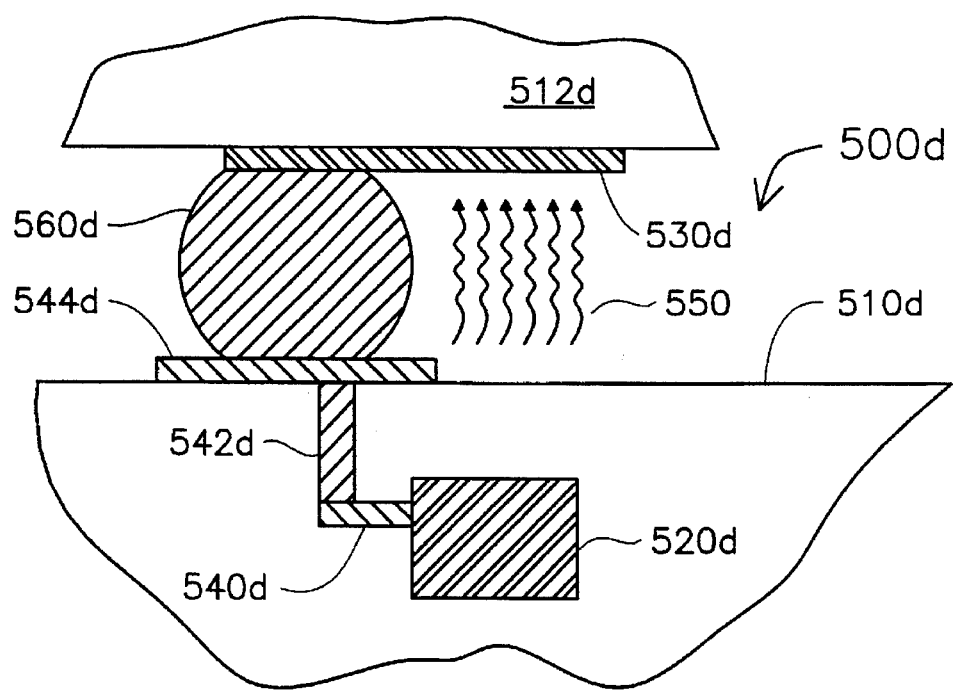
FIG. 5d is a cross-sectional view of another semiconductor device assembly employing a superconductive element to provide thermal protection, according to the invention.

The embodiments of FIGS. 5a and 5b rely on a superconductive trace on a semiconductor device. FIGS. 5c and 5d illustrate that the superconductive trace can be located off of the semiconductor device, e.g., on a leadframe, mounting substrate, or other suitable external structure.

FIG. 5c is a cross-sectional view of a semiconductor device assembly 500c comprising a semiconductor device 510c and a mounting substrate 512c joined by a solder ball connection 560c. The semiconductor device 510c has an active CMOS electronic element 520c formed therewithin. As before, the device incorporates MOS transistors which are subject to the aforementioned latch-up condition. Electrical conductors 540c and 542c extend from the electronic element 520c to a bond pad 544c on the surface of the semiconductor device 510c. The bond pad 544c is connected electrically to a superconductive trace 530c on the surface of the mounting substrate 512c by the solder ball connection 560c. The superconductive trace 530c is used to carry a current (i) to the circuit element 520b via the solder ball 560c, the pad 544c, and the conductors 540b and 542b. In the event that the circuit element 520c latches up, an increase in the current (i) occurs. The superconductive trace 530c behaves in much the same manner as described for the superconductive trace 530a, being sized (in Gross-section) such that the increased current causes current density in the superconductive trace 530c to exceed its superconductivity limits, thereby causing the superconductive trace 530c to become non-superconductive (resistive). As a result of the new resistance in the trace 530c, it immediately heats up, completely quenching superconductivity and effectively cutting off the current (i) to a level where the latch-up condition is terminated. When the superconductive trace 530c cools again, its superconductivity is restored, thereby restoring normal operation of the circuit element 520c.

FIG. 5d is a cross-sectional view of another semiconductor device assembly 500d, similar to the semiconductor device assembly 500c, comprising a semiconductor device 510d and a mounting substrate 512d joined by a solder ball connection 560d. The semiconductor device 510d has an active CMOS electronic element 520d formed therewithin. As before, the device incorporates MOS transistors which are subject to the aforementioned latch-up condition. Electrical conductors 540d and 542d extend from the electronic element 520d to a bond pad 544d on the surface of the semiconductor device 510d. The bond pad 544d is connected electrically to a superconductive trace 530d on the surface of the mounting substrate 512d by the solder ball connection 560d. Like the superconductive trace 530b described hereinabove with respect to FIG. 5b, however, the superconductive trace 530d is positioned such that it is subjected to heat 550 emanating from the circuit element 520d. In the event that the circuit element 520d latches up, heat generated by the circuit element 520d heats the superconductive trace 530d and completely quenches its superconductivity, effectively cutting off the circuit element 520d and terminating the latch-up condition. When the circuit element 520d and superconductive trace 530d cool again, superconductivity is restored thereby restoring normal operation of the circuit element 520d.

It will be readily appreciated that the superconductive "circuit breaker" traces described hereinabove with respect to FIGS. 5a–d can also be used to interrupt or limit current to a circuit which behaves as a "reset" circuit for the affected device. That is, the latch-up current can also be eliminated indirectly by an auxiliary circuit on the semiconductor device.

In such an arrangement, interruption or limitation of current through a superconductive trace such as those described with respect to FIGS. 5a–d can be sensed by a circuit other than the latched-up circuit. This other circuit can then trigger other electronic protection mechanisms within the semiconductor device, such as shutting down and/or resetting related circuit elements. Further, such "auxiliary" circuitry could be used to provide a signal to external (to the semiconductor device) computing equipment indicating that a local latch-up condition or failure has occurred within the semiconductor device.

These, and other objects, features, advantages and embodiments of the invention, including other (i.e., additional) embodiments of the techniques discussed above may become apparent to one having skill in the art to which this invention most nearly pertains, and such other embodiments are deemed to be within the spirit and scope of the present invention.

For example, any of a number of superconductive materials can be employed, including superconductive materials having the generalized composition of $(La_{1-x}M_x)_yCuO_{4-\delta}$ (where M is an alkali earth metal or a mixture of alkali earth metals; x=0 to 1, y=1.5 to 2.5; and $\delta$=0 to 1) or $(N_{1-x}M_x)_pCu_qO_{7-\delta}$ (where N is Sc, Y, or a lanthanide; x=0 to 1, y=1.5 to 2.5; p=2.5 to 3.5, q=1.5 to 3.5, and $\delta$=0 to 1) which are known to include high temperature superconductors which exhibit superconductivity above the temperature of liquid nitrogen. Such superconductive materials can be finely ground into a powder and mixed with an organic solvent (e.g., octyl alcohol, propylene glycol, or heptyl alcohol) to form a conductive paste which can be screen printed on a substrate which is non-reactive to the superconductive material.

Another suitable technique provides a precursor material by preparing a solution of a solvent and metal-ligand compounds of each of the metal components (in appropriate proportions) of a superconductive material. The solution is sprayed to form fine droplets. The solvent is then evaporated (at least in part) from the liquid droplets so that fine solid particles are formed. The solid particles are combined in a liquid carrier to form a precursor paste which can be screen printed onto a substrate. After printing with the paste, the substrate and paste are heated in the presence of oxygen to volatilize the ligands and to convert the precursor to a superconductor.

What is claimed is:

1. A method, of protecting a semiconductor device from current and/or heat overload, comprising:

providing a semiconductor device having a circuit element formed therewithin;

supplying current to the circuit element via a superconductive trace; and causing the superconductive trace to become non-superconductive and have a resistance in response to heat from the circuit element, thereby limiting the current to the circuit element.

2. A method, according to claim 1, wherein:

the superconductive trace is provided on a surface of the semiconductor device.

3. A method, according to according to claim 1, wherein:

the superconductive trace is provided on a structure spaced apart from the semiconductor device.

4. A method, according to claim 1, further comprising:

positioning the superconductive trace such that it is affected by heat generated by the circuit element.

5. A method, according to claim 1, wherein:

the superconductive trace becomes non-superconductive in response to heat from the circuit element.

6. A method, according to claim 5, wherein the non-conductive trace becomes superconductive when the circuit element is not producing excess heat.

7. Method for reducing CMOS latch-up in a semiconductor device, comprising:

supplying current, over a superconductive trace, to a CMOS circuit element on a semiconductor die;

positioning the superconductive trace proximate to the CMOS circuit element; and causing the superconductive trace to become non-superconductive and have a resistance in response to heat caused by improper operation of the CMOS circuit element, thereby limiting the current to the improperly operating CMOS circuit element.

* * * * *